United States Patent [19]

Tanabe

[11] Patent Number: 5,512,494
[45] Date of Patent: Apr. 30, 1996

[54] METHOD FOR MANUFACTURING A THIN FILM TRANSISTOR HAVING A FORWARD STAGGERED STRUCTURE

[75] Inventor: Hiroshi Tanabe, Tokyo, Japan

[73] Assignee: NEC Corporation, Tokyo, Japan

[21] Appl. No.: 349,993

[22] Filed: Nov. 29, 1994

[30] Foreign Application Priority Data

Nov. 29, 1993 [JP] Japan .................................. 5-297141

[51] Int. Cl.$^6$ .................................................. H01L 21/84
[52] U.S. Cl. .................. 437/21; 437/40; 437/41; 437/174; 437/907; 437/186; 437/24
[58] Field of Search ............................ 437/21, 41, 101, 437/173, 909, 907, 24, 174, 186, 40 TFT, 41 TFT; 257/57, 59, 347

[56] References Cited

U.S. PATENT DOCUMENTS

| 4,375,993 | 3/1983 | Mori et al. . | |
| 5,254,208 | 10/1993 | Zhang | 156/603 |
| 5,328,861 | 7/1994 | Miyakawa | 437/40 |
| 5,372,958 | 12/1994 | Miyasaka et al. | 437/40 |

FOREIGN PATENT DOCUMENTS

| 2208942A | 8/1990 | Japan | 437/40 |

OTHER PUBLICATIONS

"Excimer Laser Annealed poly-Si TFTs for CMOS Circuits", by Sera et al., Extended Abstracts of the 1991 International Conference on Solid State Devices and Materials, Yokohama, 1991, pp. 590–592.

*Primary Examiner*—George Fourson
*Assistant Examiner*—Richard A. Booth
*Attorney, Agent, or Firm*—Sughrue, Mion, Zinn, Macpeak & Seas

[57] ABSTRACT

A thin film transistor having a staggered structure and manufactured by the method of the invention comprises a first amorphous silicon film of a uniform thickness including source and drain regions, a second amorphous semiconductor film acting as a channel layer, a gate insulating film and a gate electrode laminated on a glass substrate in this order. An interface between the semiconductor film and the gate insulating film is formed flat from the source region to the drain region through a channel region. The thin film transistor formed in a staggered structure features a uniform drain current distribution and a high carrier mobility which improve current drivability and LCD image quality when used in a LCD.

13 Claims, 3 Drawing Sheets

METHOD FOR MANUFACTURING A THIN FILM TRANSISTOR HAVING A FORWARD STAGGERED STRUCTURE

BACKGROUND OF THE INVENTION

1. Field of the Invention

The present invention relates to a method for manufacturing a thin film transistor having a staggered structure and, more particularly, to a method for fabricating a thin film transistor formed on an insulator suitable for application to liquid crystal displays, contact type image sensors, vacuum fluorescent character display and the like.

2. Description of the Related Art

For reduction in costs and for obtaining a high definition function for liquid crystal displays, there is a need for active elements having a higher-speed switching function as compared with conventional hydrogenated amorphous silicon thin film transistors which have been used for driving a liquid crystal display. One such an active element under development is a polysilicon thin film transistor wherein a polysilicon thin film is formed as its active layer by an excimer laser annealing technology. According to the excimer laser annealing technology, a silicon thin film formed on a glass substrate is irradiated by an excimer laser (ultraviolet rays and short-pulsed Laser), thereby melting and recrystallizing only the silicon thin film or annealing-off crystal deflects therein, for obtaining excellent characteristic of a polysilicon thin film. Since the method uses ultraviolet rays and short-pulsed laser, laser energy is absorbed only by the silicon surface without inducing thermal damages on the underlying insulating substrate, thereby annealing the silicon thin film at high temperatures. Accordingly, a general-purpose glass with a low softening point can be used as a substrate material.

Structures of thin film transistors using such a polysilicon thin film include planar type, stagger type and inverted stagger type. Staggered structure transistors (e.g. K. Sera et al., Extended Abstracts of the 1991 International Conference on SSDM (Solid State Devices and Materials), Yokohama, 1991, pp. 590–592) have an advantage of a low leakage current in contrast with transistors of the planar type and other types. FIG. 1 is a cross-sectional view of a conventional thin film transistor of this type using a polysilicon thin film. A gate electrode 5, a gate insulation film 4, a polysilicon active layer 7, an $n^+$ silicon layer 10 doped with phosphorus and a tungsten silicide (hereinafter referred to as WSi) layer 8 are laminated on a glass substrate 1 to form thin film transistors.

The thin film transistors of this type has advantages of a high-speed function and a low leakage current flowing through source and drain junctions.

SUMMARY OF THE INVENTION

It is an object of the present invention to improve conventional staggered type thin film transistors and to provide a method for manufacturing a thin film transistor of a staggered type having uniform electric characteristics.

It is another object of the present invention to provide a method for manufacturing a thin film transistor having a higher performance in terms of carrier mobility.

According to the present invention, there is provided a method for forming a semiconductor device including steps of: forming a first semiconductor film including a source region and a drain region on an insulating surface of a substrate, the first semiconductor film having a substantially uniform thickness; forming a second semiconductor film on the first semiconductor film without patterning of the first semiconductor film; irradiating a laser beam onto the second semiconductor film for annealing the second semiconductor film; forming a gate insulating film and a gate electrode on the second semiconductor film after the irradiating of laser beam.

BRIEF DESCRIPTION OF THE DRAWINGS

The above and other objects, features and advantages of the present invention will be more apparent from the following description taken in conjunction with accompanying drawings in which.

DESCRIPTION OF THE PREFERRED EMBODIMENTS

Before describing embodiments of the present invention, problems involved in the conventional thin film transistor using a polysilicon thin film will be described with reference to FIG. 1 for the sake of understanding the present invention.

As for a structural drawback, there is a stepped structure in a region C including a junction between a source/drain region 10 and an active region in the active layer 7. The stepped structure induces an ununiformed electric field distribution between source and drain as well as between gate and drain during operation thereof. An excessively strengthened electric field at a drain edge of Region C as shown in FIG. 1 causes an unexpected breakdown of the thin film transistor to reduce performances thereof in terms of driving voltage and reliability. Moreover, during patterning to form source and drain regions, there arise a variance in a corner angle on an edge and a variance in a deposition thickness of the active layer resulting in reduced breakdown voltage and in variance of transistor parameters.

Secondly, in case of a thin film transistor manufactured by a process including a laser anneal step, a silicon active layer is deposited and then irradiated by laser after forming n+ or p+ source/drain patterns out of the first silicon layer.

Figure 1:
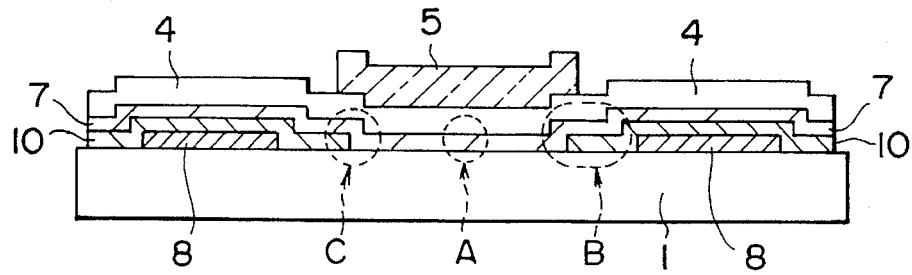
FIG. 1 is a cross-sectional view of a conventional thin film transistor of a staggered type.

At the step of laser-annealing, a difference in thickness of silicon layers between Region A and Region B indicated in FIG. 1 produces a difference in heat capacity, which in turn produces a difference in annealing temperature between both regions. As a result, the crystalline structure of the silicon layers at Region A, for example, differs from Region B, so that electric characteristics of the thin film transistors vary from region to region.

The difference as described above is verified, for example, by the fact that each of two planar type thin film transistors different from each other in a channel layer thickness has own optimum irradiation intensity which gives a highest field effect carrier mobility. In other words, the optimum irradiation intensity increases with the increased channel layer thickness. Hence, if conditions for laser annealing are set best suited for forming a channel region corresponding to Region A, a polysilicon film formed in Region B has the lower crystalline quality than that in Region A because of a difference in thermal capacity between Region A and Region B. As a result, drift carrier mobility in Region B is lower than that in Region A. This enhances a deterioration in performance and a variance in characteristics of a fabricated thin film transistor.

Now, embodiments of the present invention will be described with reference to the drawings.

Figure 2:
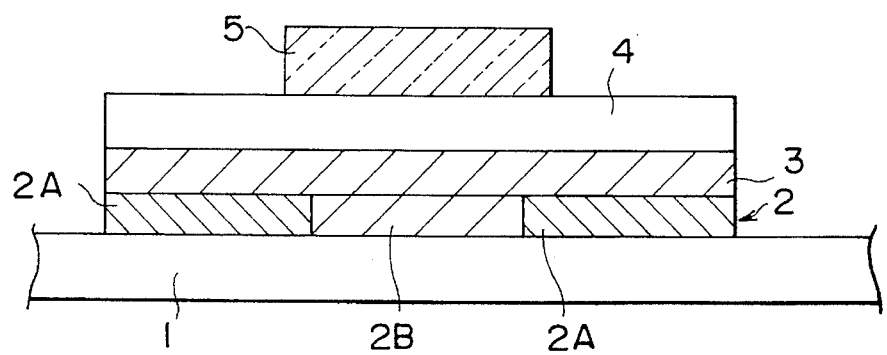
FIG. 2 is a cross-sectional view of a thin film transistor having a staggered structure manufactured by a method according to a first embodiment of the present invention.

FIG. 2 is a cross-sectional view of a thin film transistor having a staggered structure manufactured by a method according to a first embodiment of the present invention. As shown in the figure, the thin film transistor formed is comprised of a source/drain layer 2, a semiconductor channel layer 3, a gate insulating film 4 and a gate electrode 5 consecutively formed on a glass substrate 1, each having a uniform thickness. Thus, as seen from FIG. 2, the interface between the semiconductor channel layer 3 and the gate insulating film 4 in the laminated structure is free of a stepped structure. Portion 2B of the source/drain layer 2 disposed between source and drain regions 2A acts as a part of a channel.

Usually, an impact ionization of carriers resulting from an excessively concentrated electric field on a drain edge causes a reduction in a source-to-drain breakdown voltage. However, stepped structures are removed by the method according to the embodiment so that it is possible to reduce an unwanted electric field concentration resulting from a stepped structure. Hence, it is possible in the present invention to improve a breakdown voltage by relaxing a concentration of electric field around the drain region.

Now, method for manufacturing the thin film transistor of FIG. 2 will be described. First, a first amorphous silicon film 2 is deposited on an alkali-free glass substrate 1, which is followed by a selective introduction of phosphorus ions implanted into a source and drain regions 2A. Subsequently, without patterning the first amorphous silicon film 2, a second amorphous silicon film which will act as a channel layer is deposited on the first amorphous silicon layer 2. Then, laser-annealing is performed to turn the first and second amorphous silicon films 2 and 3 into a polycrystalline silicon film and to activate the impurity ions implanted into the source and drain regions 2A. Next, a silicon dioxide film is deposited as a gate insulating film 4 on the channel layer 3. Then, an aluminum film is formed to be patterned as a gate electrode 5.

Figure 7:
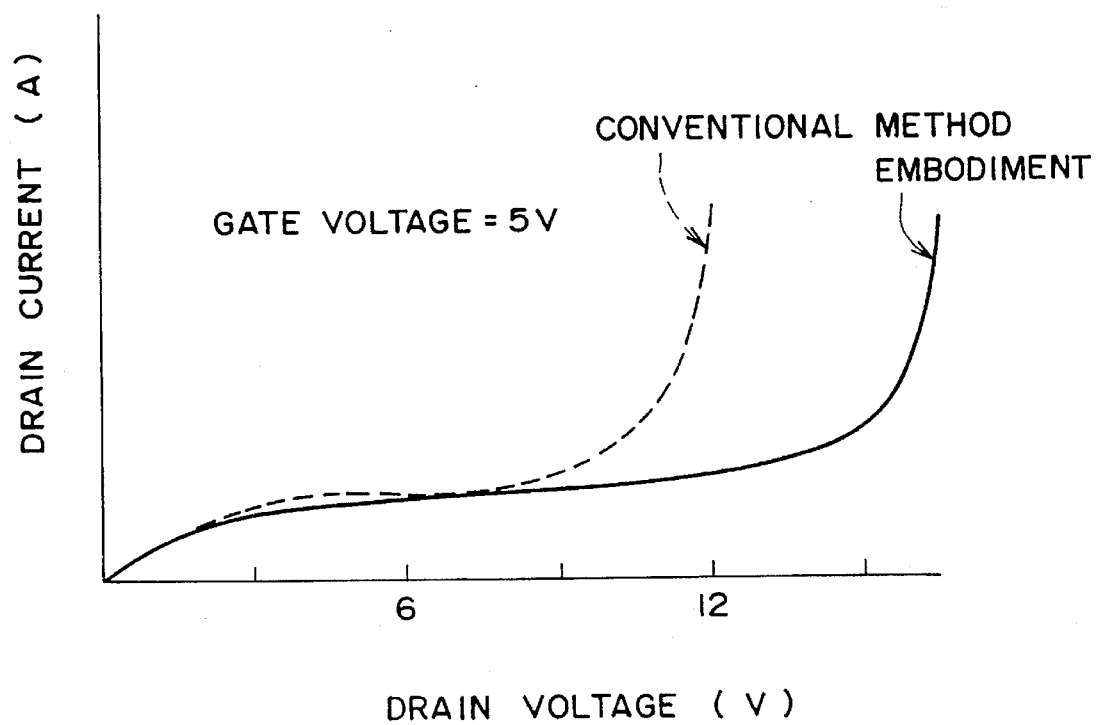
FIG. 7 is a graph showing current-voltage characteristics obtained by a thin film transistor.

Thus formed was a thin film transistor having the following characteristics: drift mobility of carrier is about 61 $cm^2/V \cdot sec$; threshold voltage is about 2.6 V; source-to-drain breakdown voltage is about 15 V or high. FIG. 7 shows source-to-drain breakdown voltages of thin film transistors manufactured by the present embodiment and by the conventional method. The present invention improves the source-to-drain breakdown voltage from about 12 V to about 15 V when gate-to-source bias condition is +5 V.

Figure 3:
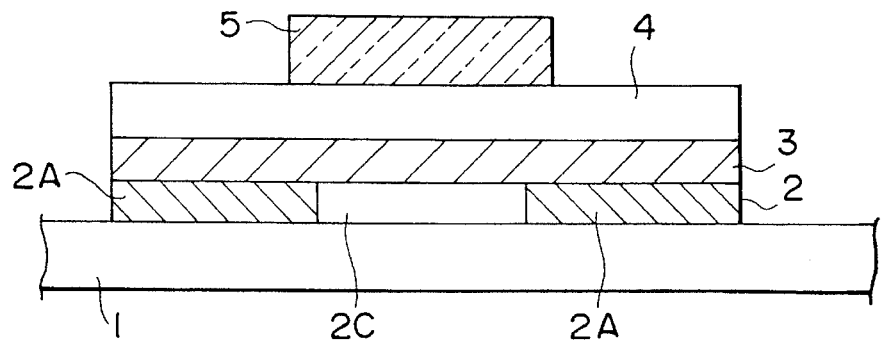
FIG. 3 is a cross-sectional view of a thin film transistor having a staggered structure manufactured by a method according to a second embodiment of the present invention.

FIG. 3 is a cross-sectional view of a thin film transistor having a staggered structure manufactured by a method according to a second embodiment of the present invention. The stagger type thin film transistor of FIG. 3 is comprised of a source/drain layer 2 including a high resistive region 2C between source and drain regions 2A, a channel layer 3, a gate insulating film 4 and a gate electrode 5 consecutively formed on a glass substrate 1. In FIG. 3, an interface between the channel layer 3 and the gate insulating film 4 is also free of a stepped structure in the vicinity of the source and drain edges. However, thickness of the channel is constant along the current path in FIG. 3 that is different from the first embodiment in FIG. 2 in which the channel of the transistor is comprised of channel layer 3 and portion 2B of the first amorphous silicon film 2. A source-to-drain breakdown voltage is similar to the case of the first embodiment. By the second embodiment, however, it is possible to fabricate a thin channel layer thereby obtaining a substantially complete depletion type field effect transistor wherein a depletion layer in a channel region reaches the underlying silicon dioxide film during operation thereof. By implementing a complete depletion of the channel region, a higher mobility is attained.

The thin film transistor of FIG. 3 is manufactured by the following procedure: First, a first amorphous silicon film 2 is deposited on an alkali-free glass substrate 1, following which phosphorus ions are implanted into each of source and drain regions 2A. Subsequently, without patterning the amorphous silicon film 2, oxygen ions are implanted into a Region 2C between the source and the drain regions 2A in place of a patterning process, thereby obtaining a high resistive region 2C in the first amorphous film 2. Then, a second amorphous silicon film acting as a channel layer 3 is deposited to a thickness of 100 nm. Next, laser-annealing is performed to turn the second amorphous silicon film 3 into a polycrystalline structure. The interstitial impurity atoms implanted in source and drain regions 2A are activated at the same time. A gate insulating film 4 made of silicon dioxide is then formed on the channel layer 3. Next, an aluminum film is deposited and patterned to form a gate electrode 5.

Thus, formed was a thin film transistor having the following characteristics: drift carrier mobility is about 92 $cm^2/V \cdot sec$; threshold voltage is about 2.5 V; source-to-drain breakdown voltage is about 15 V or higher.

Figure 4:
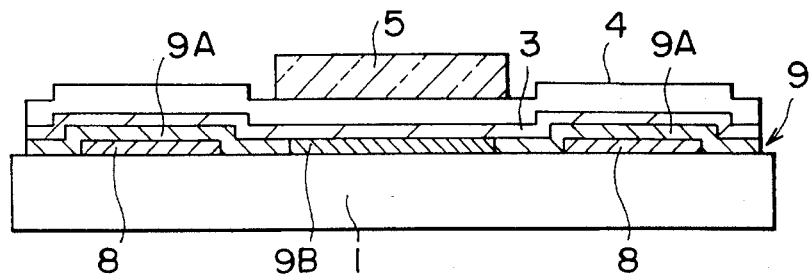
FIG. 4 is a cross-sectional view of a thin film transistor having a staggered structure manufactured by a method according to a third embodiment of the present invention.

FIG. 4 is a cross-sectional view of a thin film transistor of staggered structure manufactured by a method according to a third embodiment of the present invention. The thin film transistor of FIG. 4 is comprised of source and drain metal electrodes 8, a source/drain layer 9, a channel layer 7, a gate insulating film 4 and a gate electrode 5 consecutively formed on a glass substrate 1.

In manufacturing the thin film transistor of FIG. 4, a 50 nm-thick WSi layer is firstly sputter-deposited onto the glass substrate 1 made of an alkali-free glass substrate, following which the WSi layer is patterned by photolithography and dry etching to obtain source and drain metal electrodes 8. Next, a 75 nm-thick first amorphous silicon film 9 is deposited at 550° C. by low pressure chemical vapor deposition (hereinafter referred to as LPCVD). Then, phosphorus ions are implanted into Regions 9A of the first amorphous silicon film 9 with photoresist as a mask, thereby forming an n+ source and drain regions 9A. Subsequently, a second amorphous silicon film 3 is deposited in a thickness of 75 nm at 550° C. by LACVD and then irradiated by an excimer laser for annealing. The laser annealing conditions are 450 $mJ/cm^2$ in intensity and 5 shots per position. The irradiation by an excimer laser turns the second amorphous silicon film 3 into a polycrystalline structure, thereby increasing the electronic mobility in the channel layer 3 of the thin film transistor.

During the laser annealing process, thermal energy turned from laser beam after absorbed in the second amorphous silicon film 3 diffuses uniformly along the first amorphous silicon film 9. As a result, a uniformly crystallized polysilicon layer 3 is obtained as an active layer having a channel region located above a region 9B between the source and the drain regions 9A. A 120 nm-thick silicon dioxide film is then deposited by LPCVD to form the gate insulating film 4. A 3 μm-thick aluminum layer is then sputter deposited and patterned to form the gate electrode 5.

An integration of the thin film transistors of FIG. 4 into an array of 15 cm by 15 cm in size formed on a square glass panel provided excellent electric characteristics including a carrier mobility of 62±3.6 $cm^2/V \cdot sec$ and a threshold voltage of 2.6±0.08 V in average. In other words, the thin film transistors of FIG. 4 exhibited a high mobility and a high uniformity with a variance of about ±3%. Thin film transistors manufactured by a conventional method gave a higher carrier mobility of about 140 $cm^2/V \cdot sec$. However, their characteristics in threshold voltage varied in a range of about ±10% indicating a poor uniformity of electric characteristics. In this respect, the present embodiment provides a highly uniform laser-annealed thin film transistor of a staggered structure.

Figure 5:
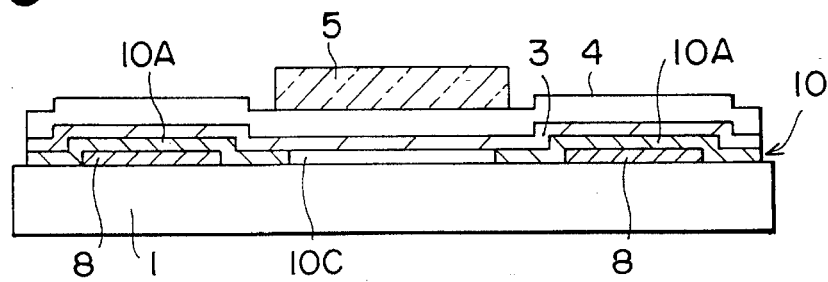
FIG. 5 is a cross-sectional view of a thin film transistor having a staggered structure manufactured by a method according to a fourth embodiment of the present invention.
Figure 6A:
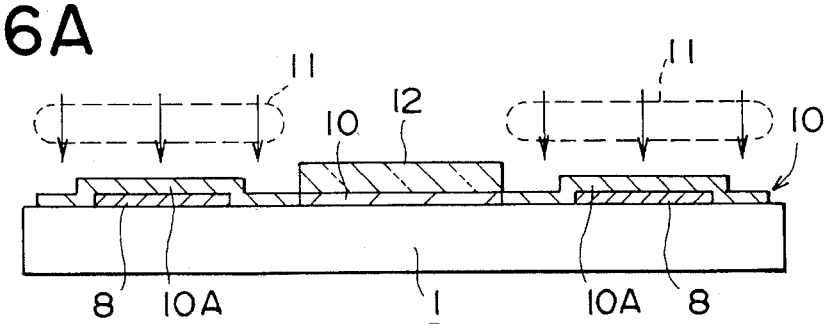
FIGS. 6A and 6B are cross-sectional views showing consecutive steps in manufacturing the thin film transistor of FIG. 5.
Figure 6B:
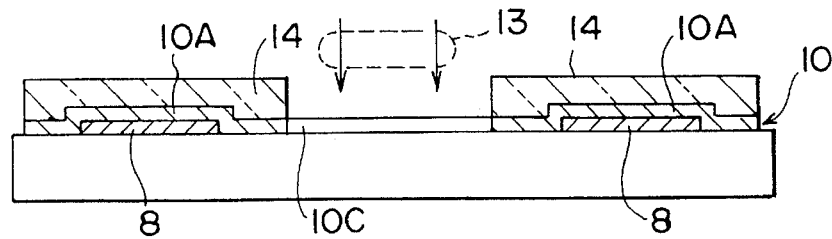

FIG. 5 shows a then film transistor having a staggered structure manufactured by a method according to a fourth embodiment of the present invention while FIGS. 6A and 6B are cross-sectional views thereof during process steps. In FIG. 5, the thin film transistor is comprised of a WSi electrodes 8, a first silicon film 10 including an insulating region 10C as well as a couple of predetermined source/drain $n^+$ regions 10A, a polysilicon active layer 7, a gate insulating film 4 and a gate electrode 5 formed consecutively on a glass substrate 1.

The thin film transistor of FIG. 5 is manufactured by the steps as shown in FIGS. 6A and 6B. In FIG. 6A, a 50 nm-thick WSi film is first sputter-deposited on an alkali-free glass substrate 1 and then patterned by a photolithography-and-RIE technology, thereby forming source and drain metal electrodes 8. A 100 nm-thick polysilicon layer 10 is then deposited at 600° C. by LPCVD. Next, phosphorus ions 11 are selectively introduced into the polysilicon layer 10 to turn the implanted area into $n^+$ source and drain regions 10A with a photoresist pattern 12 as a mask.

In FIG. 6B, oxygen ions are then implanted into a region between source and drain regions 10A with photoresist patterns 14 as masks to form an amorphous $Si_xO_y$ region 10C. In this step, oxygen ions 13 are implanted at an acceleration energy of 20 KeV and a dose density of $5E14/cm^2$.

Referring back to FIG. 5, a 50 nm-thick amorphous silicon film 3 is subsequently deposited at a temperature of 550° C. by LPCVD and then irradiated by an excimer laser beam to form a channel layer. Conditions for the laser irradiation are 400 $mJ/cm^2$ in intensity and 3 shots per position.

In the present embodiment, the polysilicon region doped with oxygen ions becomes an amorphous state due to oxygen implantation-induced lattice damages and consequently turns into an amorphous $Si_xO_y$ insulating region 10C containing a complex of amorphous silicon and oxygen. Similarly, the source and drain regions 10A of the polycrystalline film 10 become all amorphous state due to phosphorus implantation-induced lattice damage to form phosphorus-implanted amorphous source/drain regions 10A. Both insulating region 10C and source/drain regions 10A in an amorphous state exhibit similar thermal characteristics at the initial stage of laser annealing of the channel layer 3.

Accordingly, thermal energy turned from laser beam after absorbed in the amorphous channel layer 3 in the laser annealing process, propagates and diffuses uniformly along the phosphorus-implanted amorphous silicon regions 10A and amorphous $Si_xO_y$ region 10C. As a result, a channel layer 3 having electric characteristics uniform laterally in the layer 3 is obtained. A 120 nm-thick silicon dioxide layer is then deposited by LPCVD to form the gate insulating film 4. Subsequently, a 3 μm-thick aluminum layer is sputter-deposited and patterned to form the gate electrode 5.

All integration of the thin film transistors of FIG. 5 into an array of 15 cm by 15 cm in size formed on a square glass substrate provided excellent electric characteristics including a carrier mobility of 180±5.4 $cm^2/V \cdot sec$ and a threshold voltage of 2.8±0.08 V. In other words, the fabricated thin film transistors provided a high carrier mobility and highly uniform electric characteristics. Consequently, the present invention enables to manufacture a laser annealed thin film transistor in a staggered structure having a high mobility and a highly uniform characteristics, which can significantly improves an image quality of LCD devices by reducing an ununiformed luminance.

In the embodiments as mentioned above, although forming of films is carried out by LPCVD or sputtering technology, the other film fabrication technologies are also available. For example, evaporation, plasma-enhanced CVD, atmospheric pressure CVD, ion cluster beam deposition can be employed as film preparation procedures in the present invention.

As to ion-introduction steps, it is also apparent that ion doping, laser doping or the like can be employed in the present invention instead of ion-implantation.

The method according to the present invention can be applied to amorphous silicon films containing halogen atoms as an active layer used for channel formation for the purpose of grain boundary and oxide passivation instead of hydrogen passivation of grain boundaries.

Application of the present invention is not limited to an hydrogenated amorphous silicon film as an active layer but open to other semiconductive materials which have absorption bands in an ultraviolet wavelength region such as hydrogenated amorphous germanium-silicon compound semiconducting films.

Materials for the gate insulating film include a silicon nitride film, n silicon oxy-nitride film prepared, for instance, by $N_2O$-oxidation of $SiH_4$, a low permittivity oxide film including, for instance, fluorine atoms prepared in an ECR or ICP reactor etc.

Although the present invention is described with reference to the preferred embodiments, the present invention is not limited to such embodiments and it will be obvious for those skilled in the art that various modifications or alterations can be easily made based on the above embodiments within the scope of the present invention.

What is claimed is:

1. A method for forming a semiconductor device, including the steps of:

forming on an insulating surface of a substrate a first semiconductor film including a source region and a drain region, said first semiconductor film having a substantially uniform thickness;

forming a second semiconductor film on said first semiconductor film without etching a region of said first semiconductor film between the source region and the drain region;

irradiating a laser beam onto said second semiconductor film to anneal said second semiconductor film; and forming consecutively a gate insulating film and a gate electrode on said second semiconductor film after said irradiating by said laser beam.

2. A method for forming a semiconductor device as defined in claim 1 wherein said forming of said first semiconductor film includes a step of introducing oxygen ions into a region of said first semiconductor film between said source region and said drain region.

3. A method for forming a semiconductor device as defined in claim 1 wherein said forming of said first semiconductor film includes a step of implanting impurity ions to said source region and said drain region.

4. A method for forming a semiconductor device as defined in claim 1 wherein said laser beam is an excimer laser.

5. A method for forming a semiconductor device as defined in claim 1 wherein said first semiconductor film is formed in an amorphous state.

6. A method for forming a semiconductor device as defined in claim 1, wherein said second semiconductor film is formed in an amorphous state and annealed to a polycrystalline state by said irradiating of the laser beam.

7. A method for forming a semiconductor device as defined in claim 6, including a step of introducing oxygen ions into a region of said first semiconductor film between said source region and said drain region.

8. A method for forming a semiconductor device as defined in claim 1 wherein said substrate is an SOI substrate.

9. A method for forming a semiconductor device as defined claim 1 wherein said substrate is an insulator substrate.

10. A method for forming a semiconductor device including the steps of: forming on an insulating surface of a substrate a metal pattern layer acting as electrodes for a source region and a drain region; forming over said metal pattern layer a first semiconductor film including a source region and a drain region, said first semiconductor film having a substantially uniform thickness; forming a second semiconductor film on said first semiconductor film; irradiating a laser beam onto said second semiconductor film to anneal said second semiconductor film; and forming, consecutively, a gate insulating film and a gate electrode on said second semiconductor film after said irradiating by said laser beam.

11. A method for forming a semiconductor device as defined in claim 10 wherein said forming of said first semiconductor film includes a step of implanting impurity ions to said source region and said drain region.

12. A method for forming a semiconductor device as defined in claim 10 wherein said first semiconductor film is formed in an amorphous state.

13. A method for forming a semiconductor device as defined in claim 10, wherein said second semiconductor film is formed in an amorphous state and annealed to a polycrystalline state by said irradiating of the laser beam.

* * * * *

UNITED STATES PATENT AND TRADEMARK OFFICE
CERTIFICATE OF CORRECTION

PATENT NO. : 5,512,494
DATED : April 30, 1996
INVENTOR(S) : Hiroshi Tanabe

It is certified that error appears in the above-indentified patent and that said Letters Patent is hereby corrected as shown below:

Column 8, line 13, after "first semiconductor film" insert --without etching a region of said first semiconductor film between the source region and the drain region--.

Signed and Sealed this

Twentieth Day of August, 1996

Attest:

BRUCE LEHMAN

Attesting Officer

Commissioner of Patents and Trademarks